United States Patent [19]

Sawada et al.

[11] 4,410,375

[45] Oct. 18, 1983

[54] METHOD FOR FABRICATING A SEMICONDUCTOR DEVICE

[75] Inventors: Shizuo Sawada, Yokohama; Hiroshi Iwai, Tokyo; Satoshi Maeda, Kawasaki, all of Japan

[73] Assignee: Tokyo Shibaura Denki Kabushiki Kaisha, Kawasaki, Japan

[21] Appl. No.: 307,875

[22] Filed: Oct. 2, 1981

[30] Foreign Application Priority Data

Oct. 9, 1980 [JP] Japan ................................ 55-141714

[51] Int. Cl.³ ........................................... H01L 21/225
[52] U.S. Cl. ....................................... 148/187; 29/571
[58] Field of Search ................... 148/187, 188; 29/571

[56] References Cited

U.S. PATENT DOCUMENTS

| | | | |
|---|---|---|---|
| 3,457,125 | 7/1969 | Kerr | 148/187 |
| 3,913,211 | 10/1975 | Seeds et al. | 29/571 |
| 4,079,504 | 3/1978 | Kosa | 29/571 |
| 4,224,089 | 9/1980 | Nishimoto et al. | 148/187 |
| 4,270,262 | 6/1981 | Hori et al. | 29/571 |

*Primary Examiner*—G. Ozaki
*Attorney, Agent, or Firm*—Finnegan, Henderson, Farabow, Garrett & Dunner

[57] ABSTRACT

A method for fabricating a semiconductor device is disclosed which includes a step of forming contact holes in insulating films on a substrate, forming a silicate glass layer containing an impurity over the entire surface, and performing the phosphorus getter treatment using $POCl_3$ at a high temperature. Even when the phosphorus getter treatment is performed after the formation of the contact holes, the substrate or electrodes exposed through the contact holes may not be reduced in thickness or damaged. The impurity may be diffused into the substrate from the silicate glass layer through the contact holes.

14 Claims, 7 Drawing Figures

METHOD FOR FABRICATING A SEMICONDUCTOR DEVICE

BACKGROUND OF THE INVENTION

The present invention relates to a method for fabricating a semiconductor device including an improved phosphorus getter treatment step.

In the fabrication of a semiconductor device, the phosphorus getter step which uses phosphorus oxychloride POCl₃ is performed to eliminate the contamination and defects mainly in the substrate. The conventional phosphorus getter treatment will briefly be described with reference to the fabrication of a MOS dynamic RAM with a double-layered gate structure.

In the first conventional method shown in FIG. 1, a p⁺-type layer 2 (channel stop region) is formed on a predetermined part of a p-type silicon substrate 1, and a field oxide film 3 is formed thereover by the selective oxidation method. In an island-shaped element forming region separated by the field oxide film 3, a first gate electrode 5 is formed on a first gate oxide film 4, and a second gate electrode 7 is formed on a second gate oxide film 6 and on a layer insulation film 8. After forming an n⁺-type diffusion layer 9 as a digit line of the dynamic RAM in the substrate 1, an SiO₂ film 10 is formed by the CVD process over the entire surface of the structure. The phosphorus getter treatment is performed at about 1,000° C. while flowing POCl₃ under this condition. Thereafter, contact holes 11₁ and 11₂ for connection with the first and second gate electrodes and a contact hole 12 for connection with the n⁺-type diffusion layer are formed in the SiO₂ film 10. However, with this conventional method, the position of the etching mask may be misaligned during the formation of the contact hole 12 to cause the field oxide film 3 to be etched. This exposes the p⁺-type layer 2 through the contact hole 12, resulting in short circuiting. Furthermore, since the insulating film is the SiO₂ film 10, the three-dimensional pattern of the underlying layer such as the gate electrode is directly transmitted to the surface of this insulating film. This causes the disconnection of an aluminum wiring layer which is formed on the surface of this insulating film.

Another conventional method as shown in FIG. 2 is proposed to solve these problems. According to this method, a field oxide film 23 having at its underside a p⁺-type layer 22 is selectively formed in a p-type silicon substrate 21. A thermally oxidized film is grown on an island-shaped element region separated by the field oxide film 23. A polycrystalline silicon layer is deposited over the entire surface of the structure. After diffusing an n-type impurity in the polycrystalline silicon layer, it is patterned by photoetching to form a first gate electrode 25. Thereafter, the thermally oxidized film is etched using the electrode 25 as a mask to form a first gate oxide film 24. The thermal oxidation treatment is performed to grow a thick oxide film 28 as a layer insulating film. After removing the oxide film on the substrate 21, the thermal oxidation treatment is performed again and a thermally oxidized film as a second gate oxide film is grown on the exposed part of the substrate 21. After depositing a polycrystalline silicon layer over the entire surface and diffusing an n-type impurity therein, the polycrystalline silicon layer thus formed is patterned to form a second gate electrode 27. The thermally oxidized film is etched using this electrode 27 as a mask to form a second gate oxide film 26. An n⁺-type diffusion layer 29 as a digit line is formed by diffusing an n-type impurity into the substrate 21. A contact hole for connection with the first gate electrode 25 is formed at part of the oxide film 28. A CVD-SiO₂ film 30 and a boronphosphorus silicate glass film (BPSG film) 31 are sequentially formed over the entire surface. Then, contact holes 32₁, 32₂ and 32₃ are formed at parts of the BPSG film 31 and the CVD-SiO₂ film 30 which are on the contact hole described above, the second gate electrode 27 and the n⁺-type diffusion layer 29. The phosphorus getter treatment is performed at about 1,000° C. with POCl₃. According to this conventional method, the BPSG film 31 is melted by the phosphorus getter treatment step and its surface is smoothed. Simultaneously, rediffusion of phosphorus in the n⁺-type diffusion layer 29 is performed through the contact hole 32₂. Due to this, the exposed p⁺-type layer 22 is converted into an n⁺-type diffusion layer and short circuiting may thus be prevented. Since, however, the gate electrodes 25 and 27 of polycrystalline silicon are exposed through the contact holes, POCl₃ reacts with the exposed polycrystalline silicon, especially, with the impurities contained in the polycrystalline silicon. For this reason, the exposed parts of the gate electrodes are reduced in thickness and if a drastic reaction is involved holes will be formed. When the time for the phosphorus getter treatment is prolonged or the flow rate of POCl₃ is increased, not only the gate electrodes but also the n⁺-type diffusion layer 29 exposed through the contact hole 32₃ are reduced in thickness and cracks are formed.

SUMMARY OF THE INVENTION

It is an object of the present invention to provide a method for fabricating a semiconductor device according to which the phosphorus getter treatment is performed after the formation of contact holes while simultaneously rediffusing an impurity in a substrate including a diffusion region so that the gate electrodes and the substrate may not be adversely affected.

It is another object of the present invention to provide a method for fabricating a semiconductor device which utilizes the phosphorus getter treatment step to smooth an insulating film formed on a substrate so that the disconnection of a wiring layer formed on the insulating film may be prevented.

In order to achieve these objects, there is provided according to the present invention a method for fabricating a semiconductor device comprising:

forming a contact hole at part of insulating film which opens to a predetermined part of at least a conductive region on a semiconductor substrate or to an electrode;

forming a silicate glass layer containing an impurity over the entire surface of the semiconductor substrate having the contact hole;

performing a phosphorus getter treatment at a high temperature in a phosphorus oxychloride atmosphere to diffuse the impurity into the predetermined part of the semiconductor substrate or in the electrode; and removing at least the part of the silicate glass layer containing the impurity which is on the contact hole.

According to a preferable embodiment of the present invention, at least the uppermost insulating film formed on the substrate is a film of an insulator which can be melted at low temperatures, such as a film of boron phosphorus silicate glass (BPSG) or phosphorus silicate glass (PSG).

DETAILED DESCRIPTION OF THE PREFERRED EMBODIMENT

The method for fabricating a semiconductor device according to the present invention may be applied to bipolar semiconductor devices or MOS semiconductor devices, only if the method for fabricating these devices requires the step of rediffusion of an impurity after the formation of a contact hole.

A silicate glass layer containing an impurity protects, during the phosphorus getter treatment using $POCl_3$, an electrode exposed through a contact hole, especially an electrode consisting of dopedpolycrystalline silicon, and a semiconductor substrate (including a diffusion region). The silicate glass layer also serves as a rediffusion source of the impurity into the semiconductor substrate. The silicate glass containing the impurity may be phosphorus silicage glass (PSG), arsenic silicate glass (AsSG), and so on.

An insulating film formed on the substrate may be of a known type. However, it is preferable to use an insulating film of an insulator which melts at low temperatures. This is because the insulator which melts at low temperatures melts at the temperature for the phosphorus getter treatment so that its surface may be smoothed. The insulating film may preferably comprise a combination of an $SiO_2$ film and a BPSG film formed thereon. The surface of the insulating film of this combination may be smoothed and the diameter of the contact hole may be kept small. When a PSG film is formed on an $SiO_2$ film and the contact hole is formed by the wet etching method in the bilayered structure, the diameter of the contact hole becomes enlarged since the etching rate for the PSG film is greater than that for the CVD-$SiO_2$ film. To the contrary, since the etching rates for the BPSG film nd the CVD-$SiO_2$ are close to each other, the diameter of the contact hole may be kept small.

The present invention will now be described with reference to a case wherein it is applied to a method for fabricating an MOS dynamic RAM having a bilayered gate electrode of polycrystalline silicon.

Figure 1:
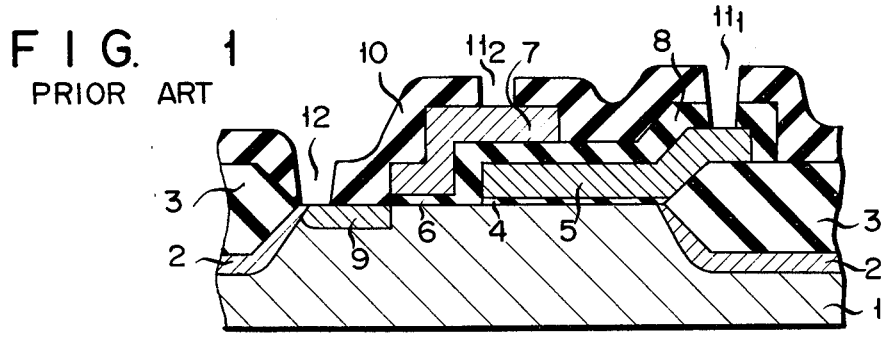
FIG. 1 is a sectional view of a semiconductor device fabricated according to a conventional method, wherein an inversion preventive layer is exposed through a contact hole.
Figure 2:
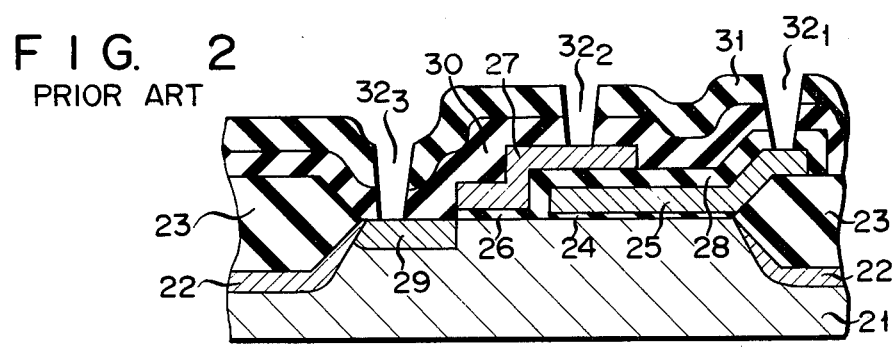
FIG. 2 is a sectional view of a semiconductor device fabricated according to another conventional method, wherein the phosphorus getter treatment is performed under the condition shown in this figure.
Figure 3:
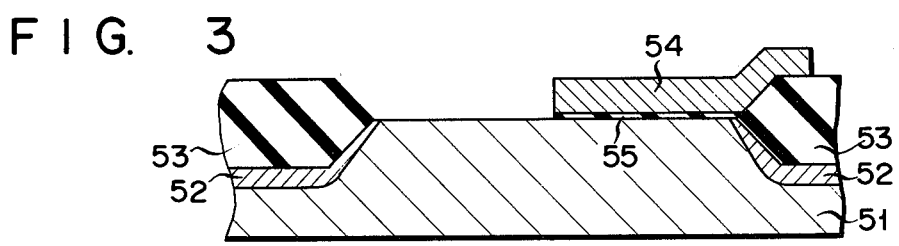
FIGS. 3 to 7 are sectional views showing the steps of a method for fabricating an MOS dynamic RAM according to an embodiment of the present invention.

First, as shown in FIG. 3, after forming a silicon nitride film over the entire surface of a p-type silicon substrate 51, the silicon nitride film is left only on the element forming region of the substrate by etching using a resist pattern as a mask. After ion implantation of boron in the field region of the substrate 51 using the resist pattern as a mask, the resist pattern is removed. A thermal oxidation treatment is performed in a wet atmosphere at 1,000° C. using the silicon nitride film as a mask to form a field oxide film 53 having a p+-type layer 52 at its underside. Subsequently, after removing the silicon nitride film, a thermally oxidzed film of 400 Å thickness is grown at the island-shaped element forming region separated by the field oxide film 53. After depositing a polycrystalline silicon layer to a thickness of 6,000 Å and diffusing phosphorus in this polycrystalline silicon layer, the polycrystalline silicon layer is patterned by photoetching to form a first gate electrode 54. Then, using the electrode 54 as a mask, the thermally oxidized film is etched to form a first gate oxide film 55.

Figure 4:
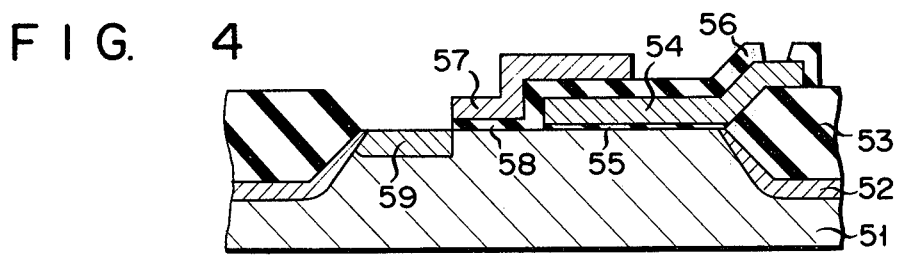

In the next step, as shown in FIG. 4, a thermal oxidation treatment is performed to form a thermally oxidized film of a thickness of 1,000 Å on the exposed surface of the substrate 51 and to form another thermally oxidized film of a thickness of 4,000 Å around the first gate electrode 54. After etching the thermally oxidized film on the substrate 51 to form a layer insulating film 56, another thermal oxidation treatment is performed to form a thermally oxidized film to become a second gate oxide film. A polycrystalline silicon layer is then deposited over the entire surface of the structure, and phosphorus is diffused in the polycrystalline silicon layer thus formed to make the resistance of this layer small. The polycrystalline silicon layer is patterned to form a second gate electrode 57. The thermally oxidized film is etched using the electrode 57 as a mask to form a second gate oxide film 58. Phosphorus is diffused at the exposed part of the substrate 51 to form an n+-type diffusion layer 69 as a digit line. The electrode layer may be made of a silicide such as molybdenum silicide in place of polycrystalline silicon.

Figure 5:
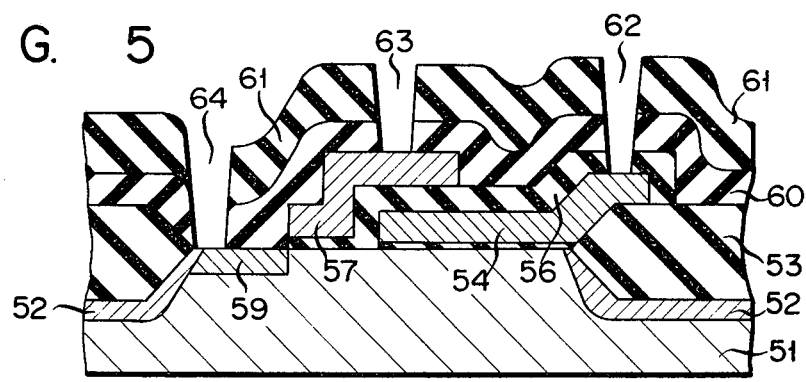

In the subsequent step, as shown in FIG. 5, an $SiO_2$ film 60 of a thickness of 3,000 Å is deposited on the entire surface of the substrate 51 and a BPSG film 61 of a thickness of 7,000 Å is deposited thereover. Although the thickness of the BPSG film is not particularly limited, it is preferably within the range of 5,000 to 9,000 Å. The concentrations of phosphorus and boron are preferably within the range of $10^{20}$ to $10^{22}$ cm$^{-3}$ and $10^{20}$ to $10^{22}$ cm$^{-3}$, respectively. Subsequently, parts of the BPSG film 61 and the $SiO_2$ film 60 on the first gate electrode 54, the second gate electrode 57, and the n+-type diffusion layer 59 are etched to form contact holes 62, 63 and 64, respectively. FIG. 5 shows the condition wherein part of the p+-type layer 52 is exposed through the contact hole 64 of the n+-type diffusion layer 59 due to the misalignment of the etching mask.

Figure 6:
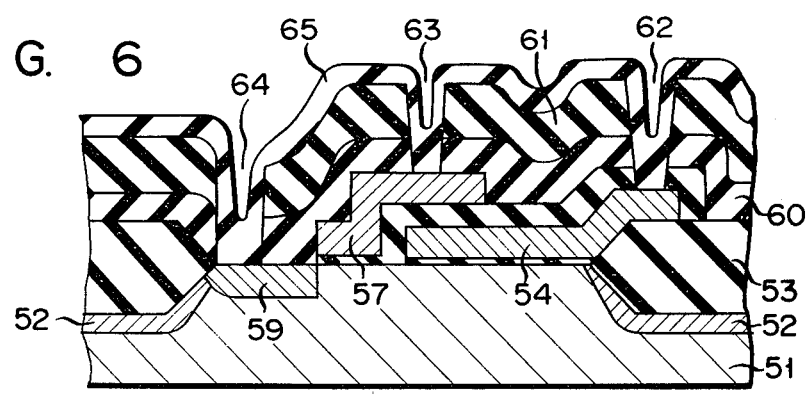

In the next step, as shown in FIG. 6, a PSG film 65 of 2,000 Å thickness is deposited over the entire surface of the substrate. The thickness of the PSG film may be less than 4000 Å, preferably within the range of 500 to 3000 Å. The concentration of the phosphorus in the PSG film is preferably within the range of $10^{20}$ to $10^{22}$ cm$^{-3}$. The phosphorus getter treatment is then performed at 1,000° C. with $POCl_3$. Since the contact holes 62, 63 and 64 are all covered by the PSG film 64 during this phosphorous getter treatment, introduction of $POCl_3$ may be prevented, and reduction in thickness of the gate electrodes 54, 57 and formation of cracks in the n+-type diffusion layer 59 may also be prevented. Phosphorus is diffused from the PSG film 65 within the contact hole 64 into the substrate 51. Therefore, even if part of the p+-type layer 52 is exposed through the contact hole 64, this part may be converted to an n+-type part so that short circuiting through this part may be prevented. Furthermore, since phosphorus is diffused from the PSG film 65 in the contact holes 62 and 63 into the gate electrodes 54 and 57 of polycrystalline silicon, good ohmic contact of the gate electrodes and the aluminum wiring layer may be guaranteed.

Figure 7:
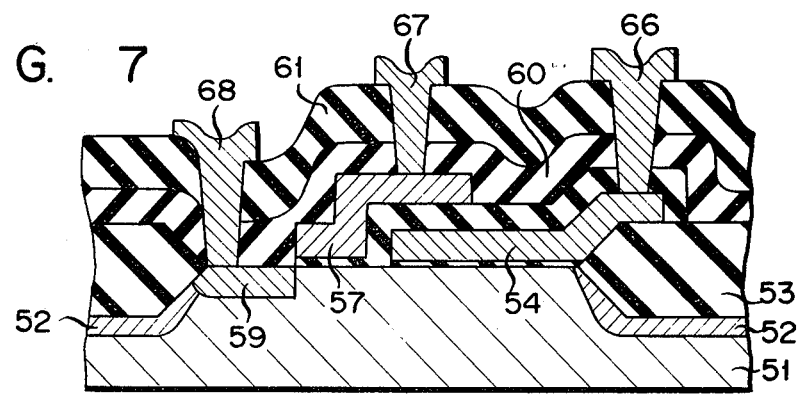

Finally, after removing the PSG film 65, aluminum is deposited by vacuum deposition on the entire surface of the structure. Then, as shown in FIG. 7, the aluminum layer thus formed is patterned to form a wiring layer 66 for connection with the first gate electrode 54, a wiring layer 67 for connection with the second gate electrode 57, and a wiring layer 68 for connection with the n+-type diffusion layer. In this embodiment, the PSG film 65 is removed entirely. However, it is to be understood that only the parts of the PSG film on at least the contact holes 62, 63 and 64 need be removed.

The BPSG film 61 shown in this embodiment is melted at a temperature of the phosphorus getter treatment so that the surface of it is smoothed, eliminating the stepped portion on its surface. Therefore, disconnection of the aluminum wiring layer when formed thereon may be prevented.

In summary, according to the present invention, after the formation of the contact holes, the phosphorus getter treatment for removing the impurities and defects in the substrate may be performed without the reduction in thickness or damage to the electrodes and substrate. In addition to this, since the rediffusion of the impurity may be performed simultaneously with the phosphorus getter treatment, the short circuiting of the wiring layer due to the misalignment of the contact holes may be prevented and the good ohmic contact of the electrodes and wiring layer may be guaranteed. Accordingly, a semiconductor device of high performance and high reliability may be provided.

What we claim is:

1. A method for fabricating a semiconductor device comprising the steps in the following order:
   forming a contact hole in an insulating film to partially expose a semiconductor region on a semiconductor substrate underlying said insulating film or an electrode layer formed on said semiconductor region underlying said insulating film;
   forming a silicate glass layer doped with an impurity on said insulating film, covering said contact hole;
   subjecting the resultant structure to a phosphorus getter treatment at a high temperature in a phosphorus oxychloride atmosphere and thereby diffusing said impurity from said silicate glass layer into said semiconductor region or into said electrode layer through said contact hole; and
   removing at least the part of said silicate glass layer within said contact hole, thereby exposing said underlying semiconductor region or electrode layer.

2. A method according to claim 1, wherein said insulating film is melted at a temperature of the phosphorus getter treatment so that the surface thereof may be smoothed.

3. A method according to claim 2, wherein said insulating film comprises an uppermost layer formed of boron phosphorus silicate glass or phosphorus silicate glass.

4. A method according to claim 1, wherein said silicate glass layer containing an impurity consists of phosphorus silicate glass containing phosphorus at a concentration of $10^{20}$ to $10^{22}$ cm$^{-3}$.

5. A method according to claim 1, wherein said silicate glass layer containing an impurity has a thickness of less than 4000 Å.

6. A method for fabricating a semiconductor device comprising:
   (a) forming an island region in a semiconductor substrate of a first conductivity type, said island region being bordered by a field oxide film;
   (b) forming a first semiconductor region of a second conductivity type opposite to said first conductivity type in a first surface area of said island region;
   (c) forming at least one electrode layer over a second surface area of said island region with a first insulating film underlying said electrode layer, said second surface area excluding said first surface area of said island region;
   (d) forming a second insulating film on the entire surface of the structure obtained after steps (a) to (c);
   (e) forming, after step (d), first and second contact holes in said second insulating film, partially exposing said first semiconductor region and said electrode layer, respectively;
   (f) forming a layer of silicate glass doped with an impurity of said second conductivity type on said second insulating film, covering said first and second contact holes;
   (g) subjecting the structure obtained after step (f) to a phosphorus getter treatment comprising exposing said structure to a phosphorus oxychloride atmosphere at a high temperature, and thereby diffusing said impurity from said silicate glass layer into at least said semiconductor substrate through said first contact hole; and
   (h) removing at least portions of said silicate glass layer within said first and second contact holes, thereby partially exposing said first semiconductor region and said electrode layer, respectively.

7. A method according to claim 6, further comprising melting, at step (g), said insulating film to smooth the surface thereof and wherein said second insulating film comprises an uppermost layer formed of boron phosphorus silicate glass.

8. A method according to claim 7, further comprising diffusing, at step (g), said impurity from aid silicate glass layer into said electrode layer through said second contact hole.

9. A method according to claim 8, wherein said boron phosphorus silicate glass uppermost layer contains phosphorus at a concentration of $10^{20}$ to $10^{22}$ cm$^{-3}$ and boron at a concentration of $10^{20}$ to $10^{22}$ cm$^{-3}$.

10. A method according to claim 8, wherein said first conductivity type is p-conductivity type and said second conductivity type is n-conductivity type.

11. A method according to claim 10, wherein said silicate glass layer is formed of phosphorus silicate glass containing phosphorus at a concentration of $10^{20}$ to $10^{22}$ cm$^{-3}$ and has a thickness of 500 to 3000 Å.

12. A method according to claim 8, further comprising forming, after step (h), wiring layers contacting with the exposed portions of said first semiconductor region and said electrode layer, respectively.

13. A method according to claim 7, wherein said second insulating layer comprises a silicon dioxide layer underlying said uppermost layer.

14. A method according to claim 6, further comprising forming, before step (d), a second semiconductor region of said first conductivity type within said semiconductor substrate and beneath said field oxide film.

* * * * *